United States Patent
Komatsu et al.

(10) Patent No.: US 7,007,212 B2
(45) Date of Patent: Feb. 28, 2006

(54) TRANSMISSION DEVICE, RECEPTION DEVICE, TEST CIRCUIT, AND TEST METHOD

(75) Inventors: Yoshihide Komatsu, Hirakata (JP); Toru Iwata, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 498 days.

(21) Appl. No.: 10/387,132

(22) Filed: Mar. 13, 2003

(65) Prior Publication Data

US 2003/0177423 A1 Sep. 18, 2003

(30) Foreign Application Priority Data

Mar. 14, 2002 (JP) ............................. 2002-070747

(51) Int. Cl.
*G01R 31/28* (2006.01)

(52) U.S. Cl. ..................................... 714/724; 714/701

(58) Field of Classification Search ................ 370/419; 324/763; 714/733, 724, 701, 731, 744; 702/119

See application file for complete search history.

(56) References Cited

U.S. PATENT DOCUMENTS

| | | | | |
|---|---|---|---|---|
| 4,811,277 A | * | 3/1989 | May et al. | 370/419 |
| 5,701,306 A | | 12/1997 | Arai | 371/22.1 |
| 5,929,650 A | * | 7/1999 | Pappert et al. | 324/763 |
| 6,047,344 A | | 4/2000 | Kawasumi et al. | 710/107 |
| 6,055,658 A | | 4/2000 | Jaber et al. | 714/726 |
| 6,343,366 B1 | * | 1/2002 | Okitaka | 714/733 |
| 6,668,237 B1 | * | 12/2003 | Guccione et al. | 702/119 |

FOREIGN PATENT DOCUMENTS

JP   09261692 A   10/1997

* cited by examiner

*Primary Examiner*—David Ton
(74) *Attorney, Agent, or Firm*—Steptoe & Johnson LLP

(57) ABSTRACT

The present invention provides a transmission device, a reception device, a test circuit and a test method, which enable internal parts of the circuit to operate at high speed, while performing inputting/outputting to/from a tester at low speed. The test circuit comprises a PLL 111 which divides the frequency of a test clock input from the tester to generate a PLL clock CKp1, a FIFO 113 which stores input data input from the tester on the test clock and outputs the data on the PLL clock CKp1, an encoder 114 which distributes bits of the input data, a driver 115 which transmits the output signal from the encoder 114 to the outside, a PLL 121 which divides the frequency of the test clock to generate a PLL clock CKp2, a decoder 124 which arranges the bits of the signal received by a receiver 123.

14 Claims, 6 Drawing Sheets

Fig.2(a) input test pattern

| unit time | CK | D0 | D1 | D2 | D3 | D4 | D5 | D6 | D7 | D8 | D9 |
|---|---|---|---|---|---|---|---|---|---|---|---|
| 10nS | 0 | 1 | 0 | 0 | 0 | 0 | 0 | 0 | 0 | 0 | 0 |
| 10nS | 0 | 1 | 0 | 0 | 0 | 0 | 0 | 0 | 0 | 0 | 0 |
| 10nS | 0 | 1 | 0 | 0 | 0 | 0 | 0 | 0 | 0 | 0 | 0 |
| 10nS | 0 | 1 | 0 | 0 | 0 | 0 | 0 | 0 | 0 | 0 | 0 |
| 10nS | 0 | 1 | 0 | 0 | 0 | 0 | 0 | 0 | 0 | 0 | 0 |
| 10nS | 1 | 1 | 0 | 0 | 0 | 0 | 0 | 0 | 0 | 0 | 0 |
| 10nS | 1 | 1 | 0 | 0 | 0 | 0 | 0 | 0 | 0 | 0 | 0 |
| 10nS | 1 | 1 | 0 | 0 | 0 | 0 | 0 | 0 | 0 | 0 | 0 |
| 10nS | 1 | 1 | 0 | 0 | 0 | 0 | 0 | 0 | 0 | 0 | 0 |
| 10nS | 1 | 1 | 0 | 0 | 0 | 0 | 0 | 0 | 0 | 0 | 0 |
| 10nS | 0 | 0 | 1 | 0 | 0 | 0 | 0 | 0 | 0 | 0 | 0 |
| 10nS | 0 | 0 | 1 | 0 | 0 | 0 | 0 | 0 | 0 | 0 | 0 |
| 10nS | 0 | 0 | 1 | 0 | 0 | 0 | 0 | 0 | 0 | 0 | 0 |
| 10nS | 0 | 0 | 1 | 0 | 0 | 0 | 0 | 0 | 0 | 0 | 0 |
| 10nS | 1 | 0 | 1 | 0 | 0 | 0 | 0 | 0 | 0 | 0 | 0 |
| 10nS | 1 | 0 | 1 | 0 | 0 | 0 | 0 | 0 | 0 | 0 | 0 |
| 10nS | 1 | 0 | 1 | 0 | 0 | 0 | 0 | 0 | 0 | 0 | 0 |
| 10nS | 0 | 0 | 0 | 1 | 0 | 0 | 0 | 0 | 0 | 0 | 0 |
| 10nS | 0 | 0 | 0 | 1 | 0 | 0 | 0 | 0 | 0 | 0 | 0 |
| 10nS | 0 | 0 | 0 | 1 | 0 | 0 | 0 | 0 | 0 | 0 | 0 |

Rows 1–10: Dg1; Rows 11–20: Dg2

Fig.2(b) output test pattern

| unit time | D0 | D1 | D2 | D3 | D4 | D5 | D6 | D7 | D8 | D9 |
|---|---|---|---|---|---|---|---|---|---|---|
| 10nS | H | L | L | L | L | L | L | L | L | L |
| 10nS | H | L | L | L | L | L | L | L | L | L |
| 10nS | H | L | L | L | L | L | L | L | L | L |
| 10nS | H | L | L | L | L | L | L | L | L | L |
| 10nS | H | L | L | L | L | L | L | L | L | L |
| 10nS | H | L | L | L | L | L | L | L | L | L |
| 10nS | H | L | L | L | L | L | L | L | L | L |
| 10nS | H | L | L | L | L | L | L | L | L | L |
| 10nS | H | L | L | L | L | L | L | L | L | L |
| 10nS | L | H | L | L | L | L | L | L | L | L |
| 10nS | L | H | L | L | L | L | L | L | L | L |
| 10nS | L | H | L | L | L | L | L | L | L | L |
| 10nS | L | H | L | L | L | L | L | L | L | L |
| 10nS | L | H | L | L | L | L | L | L | L | L |
| 10nS | L | H | L | L | L | L | L | L | L | L |
| 10nS | L | H | L | L | L | L | L | L | L | L |
| 10nS | L | H | L | L | L | L | L | L | L | L |
| 10nS | L | L | H | L | L | L | L | L | L | L |
| 10nS | L | L | H | L | L | L | L | L | L | L |
| 10nS | L | L | H | L | L | L | L | L | L | L |

Rows 1–9: Dg3; Rows 10–20: Dg4

TRANSMISSION DEVICE, RECEPTION DEVICE, TEST CIRCUIT, AND TEST METHOD

FIELD OF THE INVENTION

The present invention relates to a transmission device, a reception device, a test circuit and a test method and, more particularly, to a transmission device, a reception device, a test circuit and a test method for performing a high-speed operation in the circuit while inputting/outputting data to/from a tester at low speed.

BACKGROUND OF THE INVENTION

There is an increasing need for transmitting large quantities of data at high speed with the rapid spread of televisions and DVD devices for digital broadcasting. Accordingly, standards on high-speed serial data interfaces such as DVI (Digital Visual Interface) and IEEE1394 attract attention at present, and there have been developed semiconductor integrated circuits for high-speed transmission, which are equipped with such interface technology to transmit differential data at high speed.

The high-speed transmission semiconductor integrated circuit which meets the standards such as DVI and IEEE1394 usually comprises a transmitting end for transmitting data and a receiving end for receiving data transmitted from a communication partner. The transmitting end of the high-speed transmission semiconductor integrated circuit differentially transmits data at high speeds ranging from 1 Gbit/s to 2.65 Gbit/s by a driver circuit. The receiving end differentially receives the high-speed data transmitted from the communication partner (transmitting end) by a receiver circuit. While each of the transmitting end and the receiving end may be formed as one chip of a semiconductor integrated circuit, the transmitting end and the receiving end may be formed integrally on one chip of a semiconductor integrated circuit.

Tests for the high-speed transmission semiconductor integrated circuit are performed as follows. On the transmitting end, a signal output from a device-under-test semiconductor (hereinafter, referred to as a "DUT") is input to a semiconductor tester (hereinafter, referred to as a "tester"), and a pattern collation between the sampled output signal and an expected value held by the tester is performed, thereby sorting out defectives. On the other hand, on the receiving end, initially the tester outputs a test clock of a frequency that is defined under the test specifications and test data at a transmission rate that is defined under the test specifications to operate the DUT. Then, the output signal from the DUT is input to the tester, and a pattern collation between the sampled output signal and the expected value held by the tester is performed, thereby sorting out defectives.

However, in recent years, the speed of data transmission in the high-speed transmission semiconductor integrated circuits is increased, and the transmission rate of the DUT exceeds a testing capability of the tester. To avoid problems of the transmission rate or the frequency, the high-speed semiconductor integrated circuit frequently adopts as a BIST (Built In Self Test), a loopback system in which data transmitted from the DUT at the transmitting end are received by the DUT at the receiving end as they are.

A conventional test circuit employing the loopback system will be described with reference to FIG. 6.

FIG. 6 is a block diagram illustrating a construction of the conventional test circuit of a high-speed transmission semiconductor integrated circuit and a conventional test method.

In FIG. 6, numeral 100*f* denotes a DUT which has a transmitting-end test circuit 110*f* for conducting a test on a transmitting function and a receiving-end test circuit 120*f* for conducting a test on a receiving function. Numeral 200 denotes a tester for testing the DUT 100*f*.

The transmitting-end test circuit 110*f* comprises a PLL 117 which controls the phase of a test clock CK1 that is input from the tester 200 through a clock input terminal 131, for generating a PLL clock CKp5, a parallel/serial conversion unit (hereinafter, referred to as a "P/S") 118 for converting a 10-bit parallel input signal Din1 that is input through a test data input terminal 132, into serial data, and a driver 115 which converts the serial signal into a high-speed small-amplitude signal and outputs loop data D110 to the outside of the DUT 100*f* through a data output terminal 133.

The receiving-end test circuit 120*f* comprises a PLL 127 which controls the phase of the test clock CK1 that is input through a clock input terminal 134, for generating a PLL clock CKp6, a receiver 123 for receiving the loop data D110 input through a data input terminal 135, and a serial/parallel conversion circuit (hereinafter, referred to as an "S/P") 128 which converts the received serial loop data D110 into a parallel signal and outputs output data Dout1 to the tester 200 through a data output terminal 136.

The tester 200 comprises a transmission part 210 which generates the clock CK1 and the input data Din1 for operating the DUT 100*f* at the testing and outputs the same to the DUT, a reception part 220 for receiving the output data Dout1 output from the DUT 100*f*, and a judgement part 230 which holds an expected value for the input data Din1 and performs a pattern collation between the output data Dout1 and the expected value, thereby judging whether or not the DUT is a conforming item that performs an expected operation.

Next, a description will be given of a method for testing the so-constructed DUT 100*f* comprising the transmitting-end test circuit 110*f* and the receiving-end test circuit 120*f*.

Here, the description will be given taking a case where a communication function at an operating frequency 100 MHz and a transmission rate 1.0 Gbps, which is defined under the test specifications, is tested as an example.

To make the DUT 100*f* convert 10-bit parallel data into serial data and output the serial data at the transmission rate of 1.0 Gbps, the tester 200 is required to supply a test clock CK1 of 100 MHz and input data Din1 of 100 Mbps×10 bits to the DUT 100*f*. Thus, the transmission part 210 of the tester 200 generates the 100 MHz test clock CK1 and the 100 Mbps×10-bit input data Din1, and outputs the same to the DUT 100*f*.

When the test clock CK1 and the input data Din1 are input to the transmitting-end test circuit 110*f* of the DUT 100*f*, the PLL 117 generates from the clock CK1, a PLL clock CKp5 of the same frequency as that of the clock CK1, and outputs the PLL clock CKp5 to the P/S 118. The P/S 118 samples parallelly inputted 100 Mbps×10-bit data Din1 with the PLL clock CKp5 to be converted into a serial signal. The driver 115 converts this serial signal into a high-speed small-amplitude signal of 1.0 Gbps, and outputs the loop data D110 to the outside of the DUT 100*f* through the data output terminal 133.

The 1.0 Gbps loop data D110 which have been output to the outside of the DUT 100*f* are input to the DUT 100*f* again through the data input terminal 135. Then, in the receiving-end test circuit 120*f* of the DUT 100*f*, the receiver 123 receives the loop data D110 and outputs the data to the S/P 128. The PLL 127 generates from the clock CK1, the PLL clock CKp6 of the same frequency as that of the clock CK1, and outputs the PLL clock CKp6 to the S/P 128. The S/P 128 samples the serially input loop data D110 with the PLL clock CKp6 to be converted into a 100 Mbps×10-bit parallel signal, and outputs the output data Dout1 to the tester 200 through the data output terminal 136.

The reception part 220 of the tester 200 receives the output data Dout1 output from the DUT 100f, and outputs the data to the judgement part 230. The judgement part 230 compares the output data Dout1 with the held expected value to judge whether or not the output data coincides with the expected value, and determines that the DUT is an conforming item when they coincide with each other, while determining that the DUT is defective when they do not coincide with each other.

Further, as a BIST test, there has been developed a method of automating a test by providing a semiconductor integrated circuit with a circuit for generating a test pattern and a circuit for conducting a test utilizing an operation result on the basis of the generated test pattern.

For example, Japanese Published Patent Application No. Hei.9-261692 discloses a signal processing circuit which comprises a test pattern generation means that generates a test pattern for testing an internal operation of the signal processing circuit, a test result detection means that detects a result obtained by testing the internal operation of the signal processing circuit according to the generated test pattern, and a test timing control means that controls operational timings of the test pattern generation means and the test result detection means on the basis of a sync signal supplied to the signal processing circuit. In this signal processing circuit, when a test mode is set for the signal processing circuit on the basis of an arbitrary operation setting condition, the test pattern generation mean generates a test pattern for the operation setting condition, and an expected value of the operation result of the signal processing circuit based on the test pattern is compared with the test result detected by the test result detection means, thereby testing the signal processing circuit. Since this signal processing circuit performs the generation of the test pattern and the testing based on the generated test pattern in itself, a detailed operation test inside the signal processing circuit can be conducted simply with no additional device being provided outside.

However, since the signal processing circuit disclosed in Japanese Published Patent Application No. Hei.9-261692 generates the test pattern by the test pattern generation means, it is required to supply a signal for setting the test mode and a sync signal from the outside. Thus, even when a DUT which converts 10-bit parallel data into serial data to be transmitted (such as the DUT 100f as shown in FIG. 6) is provided with the test pattern generation means for generating the test pattern, the test result detection means for detecting the result that is obtained by testing the internal operation of the signal processing circuit according to the generated test pattern, and the test timing control means for controlling the operational timings of the test pattern generation means and the test result detection means on the basis of the supplied sync signal, as described in Japanese Published Patent Application No. Hei.9-261692, a clock of the operating frequency that is defined under the test specifications and the signal for setting the test mode must be input to the signal processing circuit from a tester in a like manner as described for the test of the DUT 100f.

However, at present, the maximum test frequency of testers which are in widespread use in a relatively affordable price range is approximately 200 Mhz. Thus, even when the test adopting the loopback system is conducted as BIST in the DUT which converts 10-bit parallel data into serial data to be transmitted, such a tester has no test capability when the transmission rate exceeds 2 Gbps, and accordingly the test cannot be carried out.

For example, when a test for assuring a transmission rate of 2 Gbps is conducted in the DUT which converts 10-bit parallel data into serial data to be transmitted, the tester needs the capability of inputting/outputting data at a rate of 200 Mbps, i.e., one tenth of the transmission rate, and inputting a clock of 200 MHz to the DUT. Further, in the case of DVI as an interface standard for digital televisions, the transmission rate reaches 2.65 Gbps, and thus the tester needs a transmission rata that is equal to or higher than 265 Mbps and an operating frequency that is equal to or higher than 265 MHz as a testing capability, to conduct a test for assuring the transmission rate of 2.65 Gbps.

However, such high-performance testers that satisfy these conditions are quite expensive and take much time to adjust a voltage, timing, or the like for maintaining the accuracy of the testers.

Therefore, it is preferable to test a high-speed transmission semiconductor integrated circuit without introducing a new high-performance tester.

SUMMARY OF THE INVENTION

The present invention has for its object to provide a transmission device, a reception device, a test circuit, and a test method, which are capable of reducing the speed of a signal that is input/output to/from a tester up to a proper level, while allowing internal parts of a high-speed transmission semiconductor integrated circuit to be operated at high speed in a test according to a loopback system.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a 1st aspect of the present invention, there is provided a transmission device comprising: a clock generation unit which operates at a higher frequency at testing, which frequency is multiplied with respect to a frequency at a normal operation; a coding unit for distributing an input signal under a prescribed rule to obtain signals having the same frequency as a frequency of a clock that is generated by the clock generation unit; and a distributed signal output unit for outputting the signals obtained by the coding unit. Therefore, even when data are input to the transmission device at a speed lower than the speed based on the test specifications, the transmission device can be tested while being operated at the speed according to the test specifications.

According to a 2nd aspect of the present invention, there is provided a reception device comprising: a clock generation unit which operates at a higher frequency at testing, which frequency is multiplied with respect to a frequency at a normal operation; a decoding unit for composing signals which are input at the same frequency as that of a clock generated by the clock generation unit, under a prescribed rule; and a composed signal output unit for outputting a signal obtained by the decoding unit. Therefore, even when the reception device is operated at a speed based on the test specifications, the output unit can output a signal at a speed lower than the speed according to the test specifications.

According to a 3rd aspect of the present invention, there is provided a test circuit comprising a transmitting-end test circuit for transmitting a first output signal on the basis of test data and a test clock which are supplied at testing, and a receiving-end test circuit for generating a second output signal from the test clock and the first output signal, in which the transmitting-end test circuit includes: a first PLL for generating a first PLL clock from the test clock; a coding unit for performing bit distribution, in accordance with the first PLL clock, to the test data which are input on the test clock; and a driver for converting the output of the coding unit into a high-speed differential signal, and outputting the first output signal, and the receiving-end test circuit includes: a receiver for receiving the first output signal; a second PLL for generating a second PLL clock from the test clock; and a decoding unit for performing bit arrangement, in accordance with the test clock, to an output signal from the receiver which is input on the second PLL clock, and outputting the second output signal. Therefore, the high-speed first and second PLL clocks can be generated on the basis of the test clock, whereby the test circuit is operated at high speed, and accordingly the frequency of the test clock that is output from a tester can be set at a frequency lower than the operating frequency based on the test specifications. Further, the test data are subjected to bit distribution and transmitted by an encoder circuit, and the output data received from the encoder circuit are subjected to bit arrangement, whereby the internal parts of the test circuit can be operated at high speed. Accordingly, even when data at a speed lower than the speed based on tho test specifications are input to the test circuit, the test can be conducted at the operating speed according to the test specifications.

According to a 4th aspect of the present invention, in the test circuit according to the 3rd aspect, the coding unit includes: a first data holding unit for capturing the test data which are input on the test clock; and an encoder circuit for performing data distribution to the data which are output from the first data holding unit on the first PLL clock, and the decoding unit includes: a decoder circuit for performing bit arrangement to the output data from the receiver; and a second data holding unit for capturing output data from the decoder circuit on the second PLL clock, and outputting the second output signal on the test clock. Therefore, the test data are subjected to bit distribution and transmitted by the encoder circuit, and the output data received from the encoder circuit are subjected to bit arrangement, whereby the internal parts of the test circuit can be operated at high speed. Accordingly, even when data at a speed lower than the speed based on the test specifications are input to the test circuit, the test can be conducted at the operating speed according to the test specifications. Further, since the first and second data holding units are provided, even when the test clock and the first and second PLL clocks are out of phases, the test can be conducted without controlling these phases.

According to a 5th aspect of the present invention, in the test circuit according to the 3rd or 4th aspect, the transmitting-end test circuit further includes a first test divider for changing the frequency division ratio of the first PLL to a prescribed value at the testing, and the receiving-end test circuit further includes a second test divider for changing the frequency division ratio of the second PLL to a prescribed value at the testing. Therefore, the high-speed first and second PLL clocks can be generated on the basis of the test clock, whereby the test circuit is operated at high speed. Accordingly, the test can be conducted in accordance with a test clock input to the test circuit, which has a frequency lower than the operating frequency of the test circuit, whereby a stable mass production test can be conducted by a conventional tester, with no need of introducing a new high-performance tester.

According to a 6th aspect of the present invention, in the test circuit according to the 3rd or 4th aspect, the transmitting-end test circuit further includes a first test divider for changing the frequency division ratio of the first PLL to a prescribed value at the testing. Therefore, in the decoding unit, the second PLL clock that is employed to capture the output data from the decoder circuit and the test clock that is employed to output the data to the tester have the same frequency, whereby the tester can sample the output data at wide time intervals when judging the output data. Accordingly, the quantity of data employed for judging the output data in a test pattern can be reduced to a great extent.

According to a 7th aspect of the present invention, there is provided a test circuit comprising: a first PLL for generating a first PLL clock from a test clock that is supplied at testing; a coding unit for performing bit distribution, in accordance with the first PLL clock, to test data which are supplied at the testing and input on the test clock; a driver for converting an output of the coding unit into a high-speed differential signal, and transmitting a first output signal; a receiver for receiving the first output signal; and a decoding unit for performing bit arrangement, in accordance with the test clock, to the output signal from the receiver which is input on the first PLL clock, and outputting a second output signal. Therefore, the first PLL clock can be commonly employed by the coding unit and the decoding unit. Further, the high-speed first and second PLL clocks can be generated on the basis of the test clock, whereby the test circuit is operated at high speed, and accordingly the frequency of the test clock which is output from a tester can be set at a frequency lower than the operating frequency based on the test specifications. Furthermore, the test data are subjected to bit distribution and transmitted by the encoder circuit, and the output data received from the encoder circuit are subjected to bit arrangement, whereby the internal parts of the test circuit can be operated at high speed. Thus, even when data at a speed lower than the speed based on the test specifications are input to the test circuit, the test can be conducted at the operating speed according to the test specifications.

According to an 8th aspect of the present invention, in the test circuit according to the 7th aspect, the coding unit includes: a first data holding unit for capturing the test data which are input on the test clock; and an encoder circuit for performing bit distribution to the data which are output from the first data holding unit on the first PLL block, and the decoding unit includes: a decoder circuit for performing bit arrangement to the output data from the receiver; and a second data holding unit for capturing output data from the decoder circuit on the first PLL clock, and outputting the second output signal on the test clock. Therefore, the test data are subjected to bit distribution and transmitted by the encoder circuit, and the output data received from the encoder circuit are subjected to bit arrangement, whereby the internal circuits of the test circuit can be operated at high speed. Accordingly, even when data at a speed lower than the speed based on the test specifications are input to the test circuit, the test can be conducted at the operating speed according to the test specifications. Further, since the first and second data holding units are provided, even when the test clock and the first and second PLL clocks are out of phases, the test can be conducted without controlling these phases.

According to a 9th aspect of the present invention, the test circuit according to the 7th or 8th aspect further includes: a first test divider for changing the frequency division ratio of the first PLL to a prescribed value at the testing. Therefore, the high-speed first PLL clock can be generated on the basis of the test clock, whereby the test circuit is operated at high speed. Accordingly, the test can be conducted in accordance with a test clock input to the test circuit, which has a frequency lower than the operation frequency of the test circuit, whereby a stable mass production test can be conducted by a conventional tester with no need of introducing a new high-performance tester.

According to a 10th aspect of the present invention, the test circuit according to the 7th or 8th aspect further includes: a second PLL for generating a second PLL clock from the test clock, and the coding unit performs bit distribution to the test data in accordance with a merge clock which is obtained by merging the first PLL clock and the second PLL clock, and the output signal from the receiver is input to the decoding unit in accordance with the merge clock. Therefore, the test circuit can be operated on the clock having a frequency that is twice as high as the frequency of the first and second PLL clocks. Accordingly, the frequency of the test clock output from a tester, and the transmission rate of the test data can be reduced.

According to an 11th aspect of the present invention, the test circuit according to the 10th aspect further includes: a second test divider for changing the frequency division ratio of the second PLL to a prescribed value at the testing. Therefore, the test circuit can be operated with the clock having a frequency that is twice as high as the frequency of the first and second PLL clocks. Accordingly, the frequency of the test clock output from a tester, and the transmission rate of the test data can be reduced.

According to a 12th aspect of the present invention, in the test circuit according to the 5th or 11th aspect, the text data are composed of identical data which are arranged continuously by N times ("N" is an integer that is equal to or larger than 2), and the frequency division ratios of the first test divider and the second test divider are 1/N. Therefore, the internal parts of the test circuit can be operated at a speed that is N times as high as the speed of the input test data and the test clock. Accordingly, even when data at a speed lower than the speed based on the test specifications are input to the test circuit, the test can be conducted at the operating speed according to the test specifications.

According to a 13th aspect of the present invention, in the test circuit according to the 6th or 9th aspect, the test data are composed of identical data which are arranged continuously by N times ("N" is an integer that is equal to or larger than 2), and the frequency division ratio of the first test divider is 1/N. Therefore, the internal parts of the test circuit can be operated at a speed that is N times as high as the speed of the input test data and the test clock. Thus, even when data at a speed lower than the speed based on the test specifications are input to the test circuit, the test can be conducted at the operating speed according to the test specifications.

According to a 14th aspect of the present invention, there is provided a test method comprising: generating from a clock that is input to a transmission device, a clock of a higher frequency that is multiplied with relative to a frequency at a normal operation; distributing first data that is input to the transmission device, under a prescribed rule, to obtain signals having the same frequency as the frequency of said clock generated in said clock generation step; outputting the distributed signals obtained in said distributing step; inputting the signals output in said distributed signal output step to a reception device; composing the signals input in said signal input step under a prescribed rule; outputting a signal obtained in said composing step; and comparing the signal output in said composed signal output step with said first data. Therefore, even when the clock and the first data are input at a speed lower than the speed based on the test specifications, the test can be conducted by an operation at the speed according to the test specifications.

BRIEF DESCRIPTION OF THE DRAWINGS

FIGS. 2($a$) and 2($b$) are diagrams explaining examples of an input test pattern (FIG. 2($a$)) and an output test pattern (FIG. 2($b$)) which are used in a test.

DETAILED DESCRIPTION OF THE PREFERRED EMBODIMENTS

Hereinafter, embodiments of the present invention will be described with reference to the drawings. The embodiments described here are given only as examples and the present invention is not restricted to these embodiments.

[Embodiment 1]

Initially, a test circuit according to a first embodiment of the present invention will be described with reference to the drawings.

Figure 1:
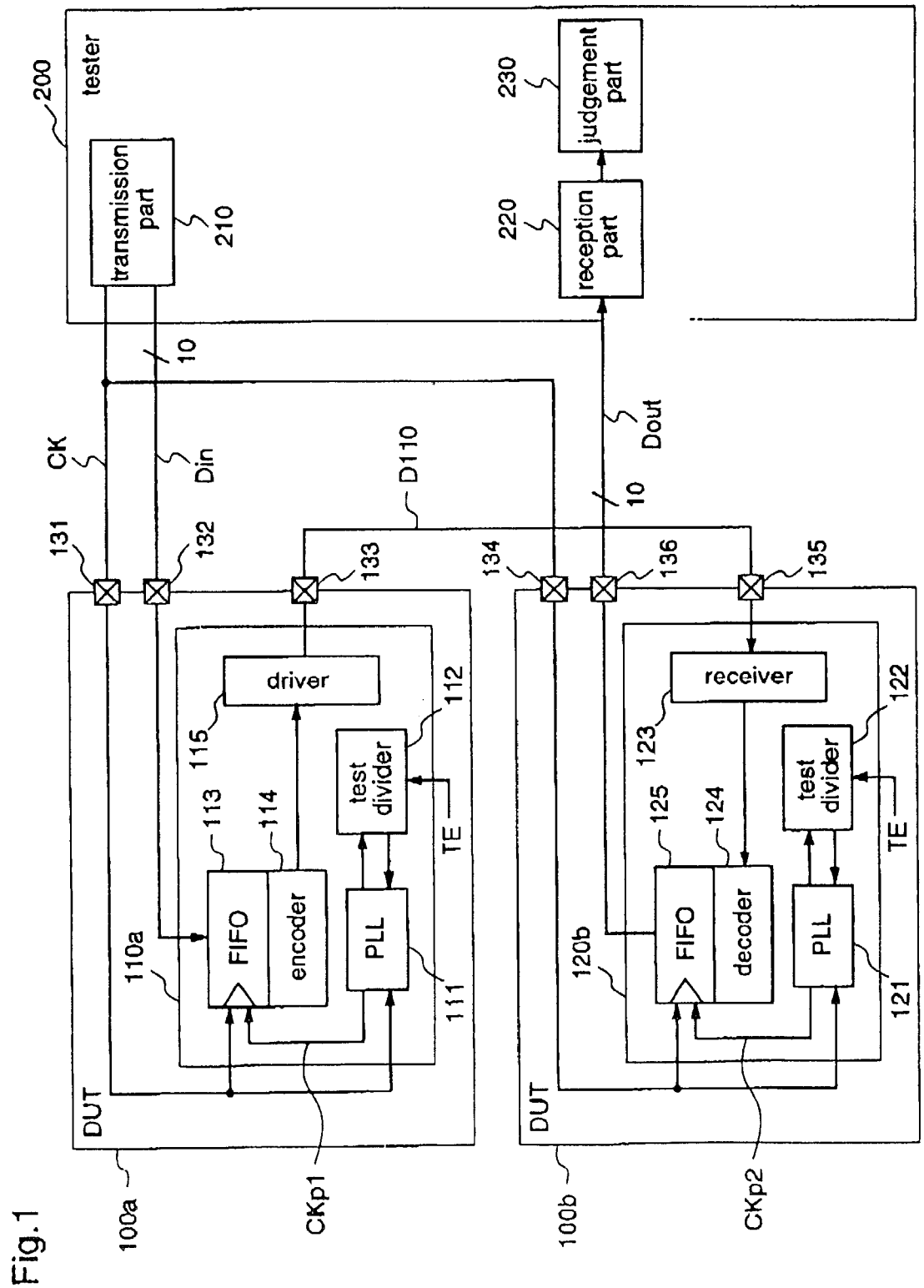
FIG. 1 is a block diagram illustrating a construction of a test circuit and a test method according to a first embodiment of the present invention.

FIG. 1 is a block diagram illustrating a construction of the test circuit and a test method according to the first embodiment.

In FIG. 1, numeral 100$a$ denotes a device-under-test semiconductor integrated circuit (hereinafter, referred to as a "DUT") which has a transmitting-end test circuit 110$a$ for conducting a test on a transmitting function, numeral 100$b$ denotes a DUT which has a receiving-end test circuit 120$b$ for conducting a test on a receiving function, and numeral 200 denotes a semiconductor tester (hereinafter, referred to as a "tester") for testing the DUTs 100$a$ and 100$b$.

The transmitting-end test circuit 110$a$ comprises a PLL 111 which divides the frequency of a test clock CK input through a clock input terminal 131 by a prescribed frequency division ratio, so as to generate a PLL clock CKp1, a test divider 112 which is activated by a test enable signal TE that is input at the testing, and changes the frequency division ratio of the PLL 111 to multiply the frequency, a FIFO 113 which stores 10-bit parallel input data Din inputted through a test data input terminal 132 in accordance with the test clock CK, and outputs the data in sync with the PLL clock CKp1, an encoder 114 which distributes bits of the parallel input data Din to be converted into a serial signal, and a driver 115 which converts the serial signal into a high-speed small-amplitude signal, and outputs loop data D110 to the outside of the DUT 100*a* through a data output terminal 133

The receiving-end test circuit 120*b* comprises a PLL 121 which divides the frequency of the test clock CK input through a clock input terminal 134 by a prescribed frequency division ratio, so as to generate a PLL clock CKp2, a test divider 122 which is activated by the same test enable signal TE as is input to the test divider 112, and changes the frequency division ratio of the PLL 121 to multiply the frequency, a receiver 123 for receiving the loop data D110 inputted through a data input terminal 135, a decoder 124 which arranges the bits of the received serial loop data D110 to be converted into a 10-bit parallel signal, and outputs the parallel signal to a FIFO 125, and the FIFO 125 which synchronizes the parallel signal that is input on the PLL clock CK2 with the test clock CK, and outputs the synchronized data Dout to the outside of the DUT 100*b* through a data output terminal 136. Here, the FIFO 113 corresponds to a first data holding unit as defined in claims, and the FIFO 125 corresponds to a second data holding unit as defined in claims.

The PLL 111 divides the frequency of the test clock CK input from the tester 200, and outputs the PLL clock CKp1. Here, the test divider 112 which is activated on the basis of the test enable signal TE inputted at the testing changes the frequency division ratio of the PLL 111 so as to increase the frequency of the PLL clock CKp1 to a prescribed value, and thus the PLL 111 outputs the PLL clock CKp1 of a prescribed frequency which is higher than the frequency at a normal operation, to the FIFO 113.

The FIFO 113 uses the test clock CK input from the tester 200 at a writing time, while using the PLL clock CKp1 which is obtained by the frequency division for the test clock CK in the PLL 111, at a reading time. That is, the FIFO 113 temporarily holds the input data Din which are input in sync with the test clock CK, and outputs the data to the encoder 114 in sync with the PLL clock CKp1.

The encoder 114 distributes the input data Din sampled on the PLL clock CKp1. For example, the encoder 114 performs bit distribution of 8B10B, thereby changing the input data Din into random data to be converted into a serial signal.

The PLL 121 divides the frequency of the test clock CK inputted from the tester 200, and outputs the PLL clock CKp2. Here, the test divider 122 which is activated on the basis of the test enable signal TE inputted at the testing changes the frequency division ratio of the PLL 121 so as to increase the frequency of the PLL clock CKp2 to a prescribed value, and thus the PLL 121 outputs the PLL clock CKp2 of a prescribed frequency which is higher than the frequency at a normal operation, to the FIFO 125.

The decoder 124 arranges the loop data D110 received by the receiver 123. For example, the decoder 124 performs bit arrangement of 10B8B, thereby converting the serial loop data D110 into a parallel signal to be outputted to the FIFO 125.

The FIFO 125 uses the PLL clock CKp2 which is obtained by the frequency division for the test clock CK in the PLL 121, at a writing time, while using the test clock CK input from the tester 200 at a reading time. That is, the FIFO 125 temporarily holds the parallel signal which is input in sync with the PLL clock CKp2, and outputs the output data Dout to the outside of the DUT 100*b* in sync with the test clock CK.

The tester 200 for testing the DUTs 100*a* and 100*b* constructed as described above comprises a transmission part 210 which generates the clock CK and the input data Din for operating the DUTs 100*a* and 100*b* at the testing, and transmits the same to the DUT 100*a* and the DUT 100*b*, a reception part 220 for receiving the output data Dout that is output from the DUT 100*b*, and a judgement part 230 which holds an expected value for the input data Din and performs a pattern collation between the output data Dout and the expected value, thereby judging whether or not the DUTs 100*a* and 100*b* are conforming items that perform expected operations.

In the test by the tester 200, test patterns (logical data) are employed to perform the generation of the test clock CK input to the DUTs 100*a* and 100*b* as well as the input data Din, or the judgement of the output data Dout.

FIGS. 2(*a*) and 2(*b*) show examples of test patterns employed for the test on high-speed communications functions of the DUT 100*a* and the DUT 100*b*. FIG. 2(*a*) illustrates input test patterns including the input test clock CK and the input data Din, and FIG. 2(*b*) illustrates output test patterns including the expected value of the output data Dout. The input data Din and the output data Dout are 10-bit data being composed of D0–D9, respectively. "0" and "1" denote input values, and "L" and "H" denote expected values. These test clocks CK and the input data Din are transmitted/received between the DUTs 100*a* and 100*b*, and the tester 200 for each predetermined unit time. Further, as the input data Din and the output data Dout, the data are arranged successively for a prescribed unit time. FIG. 2 show examples of the test patterns in which the same data are arranged successively for 10 unit times, like in data groups Dg1–Dg4.

Next, a description will be given of a method for testing the so-constructed DUT 100*a* and the DUT 100*b* employing the transmitting-end test circuit 110*a* and the receiving-end test circuit 120*b*.

Here, the description will be given taking a case where communications functions at an operating frequency of 100 MHz and a transmission rate of 1.0 Gbps, which are defined under the test specifications, are tested as an example. Further, it is assumed that a unit time is set at 10 nS.

Initially, the transmission part 210 of the tester 200 generates the test clock CK of a frequency 10 MHz and the input data Din of 10 Mbps×10 bits on the basis of the test pattern. The transmission part 210 switches between "0" and "1" by every 5 unit times, i.e., 50 ns, thereby to generate a test clock CK having a period of 100 ns. Further, the transmission part 210 generates signals which do not vary for 10 unit times, i.e., 100 ns, for data buses D0–D9 (not shown) as the respective input data Din. The test clock CK generated as described above is input to the DUT 100*a* and the DUT 100*b*, and the input data Din are input to the DUT 100*a*.

When the 10 MHz test clock CK and the 10 Mbps×10-bit input data Din are input to the transmitting-end test circuit 110*a* of the DUT 100*a*, the PLL 111 divides the frequency of the test clock CK inputted from the tester 200, thereby generating the PLL clock CKp1. Since at this time the test divider 112 activated in accordance with the test enable signal TE reduces the frequency division ratio of the PLL 111 to one tenth, the PLL 111 outputs the PLL clock CKp1 to the FIFO 113, which has a frequency of 100 MHz, i.e., ten times as high as that of the test clock CK, and a period of 10 ns as one unit time. The FIFO 113 outputs the input test data Din which are stored on the test clock CK output from the tester 200, to the encoder 114 in sync with the PLL clock CKp1. Then, the encoder 114 distributes bits of the input data Din which are sampled on the PLL clock CKp1, whereby the input data are made into random data and, thus, converted into a serial signal. Here, the input data Din in which the same values continue for 10 unit times like the data group Dg1 or Dg2 are subjected to the bit distribution by the encoder 114, so as to be converted into data in which the same value does not continue in each unit time. Then, the driver 115 converts the bit-distributed serial data into a high-speed small-amplitude signal of 1.0 Gbps, and outputs the loop data D110 to the outside of the DUT 100a.

The loop data D110 output to the outside of the DUT 100a are input to the DUT 100b. When the loop data D110 and the test clock CK generated by the tester 200 are input to the receiving-end test circuit 120b, the PLL 121 outputs the PLL clock CKp2 to the FIFO 125, which has a frequency ten times as high as that of the test clock CK, and a period of 10 ns as one unit time, since the test divider 122 activated on the basis of the test enable signal TE reduces the frequency division ratio to one tenth, in a like manner as described for the transmitting-end test circuit 110a. On the other hand, the receiver 123 receives the loop data D110 output from the DUT 100a. Then, the decoder 124 arranges the bits of the serial loop data D110 to be converted into a parallel signal. Here, the loop data D110 which have been converted by the encoder 114 of the transmitting-end test circuit 110a into data that do not take the same value for successive unit times are subjected to the bit arrangement, thereby changing the loop data into the data in which the same values continue for the 10 unit times like the data group Dg3 or Dg4, and the bit-arranged data are stored in the FIFO 125 on the PLL clock CKp2 for each unit time. The FIFO 125 synchronizes the stored parallel signal with the test clock CK having a period of 10 unit times, and output the synchronized 10 Mbps×10-bit output data Dout to the outside of the DUT 100b.

The output data Dout output as described above are received by the reception part 220 of the tester 200 and, then, input to the judgement part 230.

The judgement part 230 judges the sampled output data Dout by comparing the data with the output test pattern. For example, in the case where the output data Dout is the operation result of the DUT 100a and the DUT 100b on the basis of the data group Dg1, the judgement part 230 judges whether or not the output data Dout coincide with the data group Dg3, and determines that the DUT 100a and the DUT 100b are conforming items when the output data Dout coincide with the data group Dg3, while determining that the DUT 100a and the DUT 100b are defectives when the output data Dout do not coincide with the data group Dg3.

Here, since the judgement as to whether the DUT 100a and the DUT 100b are conforming items or defective items is made only on the basis of the output data Dout, it is impossible to determine which is defective, the DUT 100a or the DUT 100b, when the judgement result indicates defectiveness. In order to make a reliable judgement as to whether they are conforming items or defective items and sort out a defective, it is desirable that a golden device which surely performs the operation without problem is employed as one of the DUTs. By employing the golden device as the DUT 100b when the DUT 100a is tested, and employing the golden device as the DUT 100a when the DUT 100b is tested, it is possible to determine which DUT is defective when the judgement result obtained by the tester 200 indicates defectiveness.

As described above, according to the test circuit of the first embodiment, the PLL 111 and the PLL 121 divide the frequency of the low-frequency test clock CK, to generate the PLL clocks CKp1 and CKp2 having operating frequencies which are defined under the test specifications, whereby the frequency of the test clock CK output from the tester 200 can be made lower than the operating frequency according to the test specifications. Further, since the FIFO 113 and the FIFO 125 are provided, even when the phase of the test clock CK does not coincide with the phases of the PLL clocks CKp1 and CKp2, the test can be conducted without controlling these phases. Furthermore, the transmitting-end test circuit 110a distributes bits of the low-speed input data Din to convert the data into a serial signal by the encoder 114, thereby transmitting the loop data D110 at a transmission rate based on the test specifications, and the receiving-end test circuit 120b arranges the bits of the received loop data D110 to convert the data into a parallel signal by the decoder 124, thereby outputting the output data Dout at low speed. Therefore, the speed of the input data Din output from the tester 200 and the speed of the output data Dout output to the tester 200 from the receiving-end test circuit 120b can be made lower than the transmission rate according to the test specifications. In addition, even when a signal of a lower frequency than the frequency according to the test specifications is input to the DUT 100a and the DUT 100b, the test can be conducted by operating the internal parts of the DUT 100a and the DUT 100b at the frequency according to the test specifications.

[Embodiment 2]

Next, a test circuit according to a second embodiment of the present invention will be described with reference to the drawing.

Figure 3:
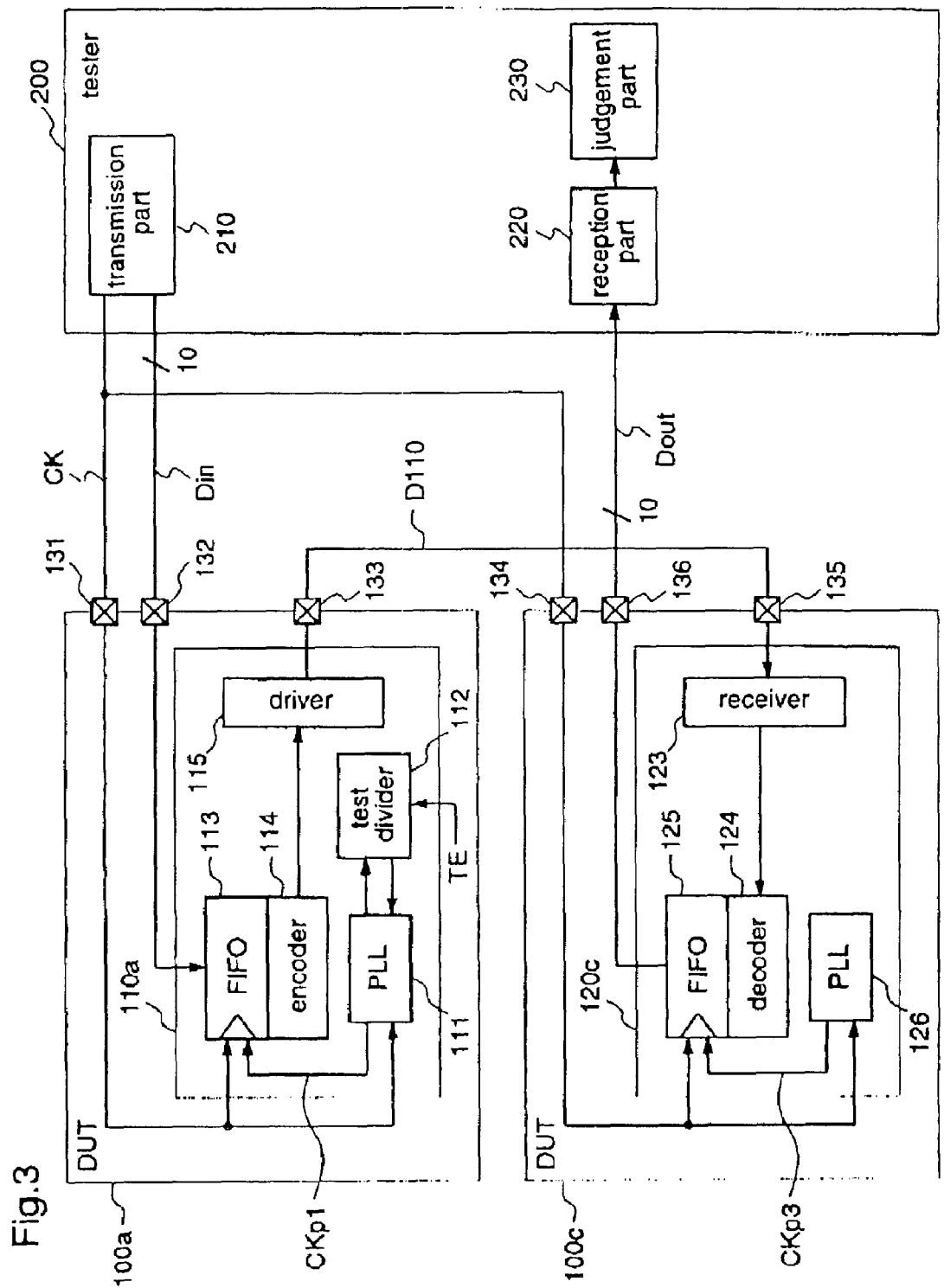
FIG. 3 is a block diagram illustrating a construction of a test circuit and a test method according to a second embodiment of the present invention.

FIG. 3 is a block diagram illustrating a construction of the test circuit and a test method according to the second embodiment. In FIG. 3, the same or corresponding parts as those shown in FIG. 1 are denoted by the same reference numerals.

As shown in FIG. 3, a receiving-end test circuit 120c of a DUT 100c according to the second embodiment is different from the receiving-end test circuit 120b according to the first embodiment in that the test divider 122 is eliminated, and the PLL 121 is replaced by a PLL 126 which does not perform frequency conversion and generates a PLL clock CKp3 of the same frequency as the frequency of a test clock CK.

That is, the receiving-end test circuit 120c comprises the PLL 126 which generates the PLL clock CKp3 of the same frequency as the frequency of the test clock CK, a receiver 123 for receiving loop data D110, a decoder 124 which arranges bits of the received loop data D110 to convert the data into a parallel signal, and outputs the signal to a FIFO 125, and the FIFO 125 which synchronizes the parallel signal that is input on the PLL clock CKp3 with the test clock CK and outputs the synchronized output data Dout to the outside of the DUT 100c through a data output terminal 136.

Next, a description will be given of a method for testing the DUT 100a and the DUT 100c constructed as described above, employing a transmitting-end test circuit 110a and the receiving-end test circuit 120c.

Here, the description will be given taking a case where a test is conducted on a communication function at an operating frequency of 100 MHz and a transmission rate of 1.0 Gbps, which are defined under the test specifications, as an example. Further, it is assumed that a unit time is set at 10 ns.

When the test clock CK of 10 MHz and input data Din of 10 Mbps×10 bits are input from a tester 200 to the transmitting-end test circuit 110a of the DUT 100a, a PLL 111 divides the frequency of the test clock CK to generate a PLL clock CKp1. At this time, a test divider 112 activated on the basis of a test enable signal TE changes the frequency division ratio of the PLL 111 to one tenth of the original ratio. Then, the PLL 111 outputs the PLL clock CKp1 to a FIFO 113, which clock has a frequency of 100 MHz, i.e., ten times as high as that of the test clock CK, and a period of 10 ns as one unit time. The FIFO 113 outputs the input test data Din which are stored on the test clock CK output from the tester 200, to an encoder 114 in sync with the PLL clock CKp1. Then, the encoder 114 distributes bits of the input data Din which are sampled on the PLL clock CKp1, whereby the input data are made into random data and, thus, converted into a serial signal. Then, the driver 115 converts this serial signal into a high-speed small-amplitude signal of 1.0 Gbps, and outputs the loop data D110 to the outside of the DUT 100a.

The loop data D110 output to the outside of the DUT 100a are input to the DUT 100c. When the loop data D110 and the test clock CK generated by the tester 200 are input to the receiving-end test circuit 120c, the PLL 126 generates the PLL clock CKp3 of the same frequency as that of the test clock CK. Further, the decoder 124 arranges the bits of the serial loop data D110 received by the receiver 123 to convert the data into a parallel signal. Here, the loop data D110 which have been converted by the encoder 114 of the transmitting-end test circuit 110a into data that do not have the same value for successive unit times are subjected to the bit arrangement, thereby making the loop data into data in which the same values continue for 10 unit times, and the bit-arranged data are stored in the FIFO 125 on the PLL clock CKp3. The FIFO 125 outputs the stored parallel signal to the outside of the DUT 100c in sync with the test clock CK having a period of 10 unit times, as the 10 Mbps×10-bit output data Dout.

As described above, according to the test circuit of the second embodiment, the PLL 111 divides the frequency of the low-frequency test clock CK to generate the PLL clock CKp1 of an operating frequency defined under the test specifications, whereby the frequency of the test clock CK output from the tester 200 can be made lower than the operating frequency according to the test specifications. Further, the transmitting-end test circuit 110a distributes bits of the low-speed input data Din to convert the data into a serial signal by the encoder 114, thereby transmitting the loop data D110 at a transmission rate based on the test specifications, and the receiving-end test circuit 120c arranges the bits of the received loop data D110 to convert the data into a parallel signal by the decoder 124, thereby outputting the output data Dout at low speed. Therefore, the speed of the input data Din output from the tester 200 and the speed of the output data Dout output from the receiving-end test circuit 120c to the tester 200 can be made lower than the transmission rate according to the test specifications. Moreover, in the FIFO 125, the PLL clock CKp3 at a writing time and the clock CK at a reading time have the same frequency, whereby the tester 200 can perform pattern collation at wide sampling intervals when judging the output data Dout. Therefore, the quantity of data in an output test pattern can be reduced to great extent.

[Embodiment 3]

Next, a test circuit according to a third embodiment of the present invention will be described with reference to the drawing.

Figure 4:
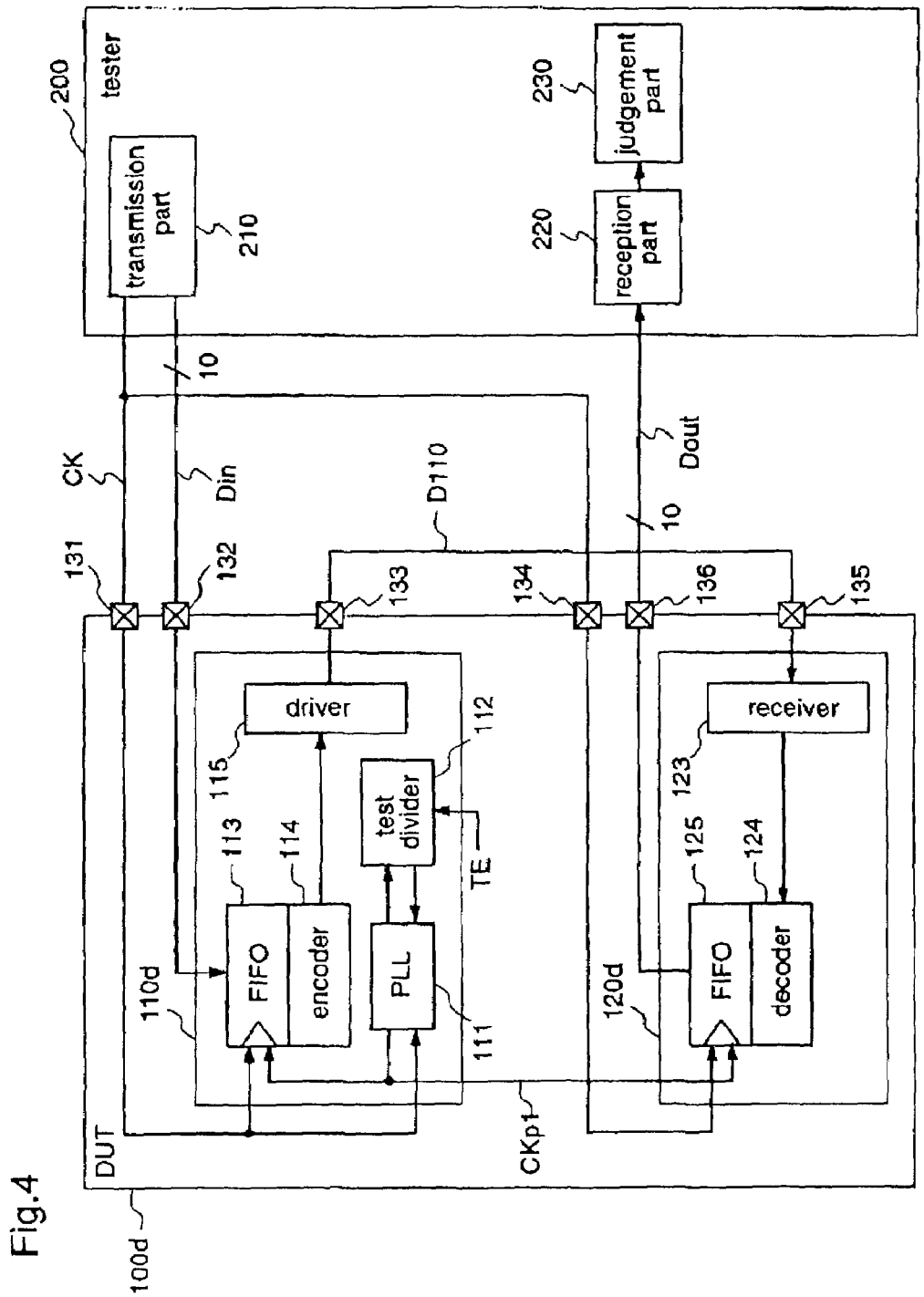
FIG. 4 is a block diagram illustrating a construction of a test circuit and a test method according to a third embodiment of the present invention.

FIG. 4 is a block diagram illustrating a construction of the test circuit and a test method according to the third embodiment. In FIG. 4, the same or corresponding parts as those shown in FIG. 1 are denoted by the same reference numerals.

As shown in FIG. 4, according to a DUT 100d of the third embodiment, a transmitting-end test circuit 110d and a receiving-end test circuit 120d are disposed on one chip, and a PLL clock CKp1 generated by a PLL 111 and a test divider 112 is transmitted to a FIFO 113 of the transmitting-end test circuit 110d and a FIFO 125 of the receiving-end test circuit 120d.

More specifically, the transmitting-end test circuit 110d comprises the PLL 111 which divides the frequency of a test clock CK by a prescribed frequency division ratio, thereby generating the PLL clock CKp1, the test divider 112 which is activated by a test enable signal TE input at testing, and changes the frequency division ratio of the PLL 111 to multiply the frequency, the FIFO 113 which stores input data D1 on the test clock CK and outputs the stored data to an encoder 114 in sync with the PLL clock CKp1, the encoder 114 which distributes bits of the parallel input data Din to convert the data into a serial signal, and a driver 115 which converts the serial signal into a high-speed small-amplitude signal, and outputs loop data D110 to the outside of the DUT 100d through a data output terminal 133.

Further, the receiving-end test circuit 120d comprises a receiver 123 for receiving the loop data D110, a decoder 124 which arranges the bits of the received loop data D110 to convert the data into a parallel signal, and outputs the parallel signal to the FIFO 125, and the FIFO 125 which stores the parallel signal on the PLL clock CKp1 generated at the transmitting-end test circuit 110d, and outputs output data Dout to the outside of the DUT 100d in sync with the test clock CK.

Next, a description will be given of a method for testing the so-constructed DUT 100d employing the transmitting-end test circuit 110d and the receiving-end test circuit 120d.

Here, the description is given taking a case where a communication function at an operating frequency of 100 MHz and a transmission rate of 1.0 Gbps, which are defined under the test specifications, is tested as an example. Further, it is assumed that a unit time is set at 10 nS.

When the test clock CK of 10 MHz and the input data Din of 10 Mbps×10 bits are input from a tester 200 to the transmitting-end test circuit 110d of the DUT 100d, the PLL 111 divides the frequency of the test clock CK to generate the PLL clock CKp1. At this time, the test divider 112 activated on the basis of a test enable signal TE changes the frequency division ratio of the PLL 111 to one tenth of the original ratio. Then, the PLL 111 outputs the PLL clock CKp1 to the FIFO 113, which has a frequency of 100 MHz, i.e., ten times as high as that of the test clock CK, and a period of 10 ns as one unit time. The FIFO 113 outputs the input test data Din which are stored on the test clock CK output from the tester 200, to the encoder 114 in sync with the PLL clock CKp1. Then, the encoder 114 distributes bits of the input data Din which are sampled on the PLL clock CKp1, whereby the input data are made into random data and, thus, converted into a serial signal. Then, the driver 115 converts this serial signal into a high-speed small-amplitude signal of 1.0 Gbps, and outputs the loop data D110 to the outside of the DUT 100d.

The loop data D110 output to the outside of the DUT 100d are input to the DUT 100d again. When the loop data D110 and the test clock CK generated at the tester 200 are input to the receiving-end test circuit 120d, the decoder 124 arranges the bits of the serial loop data D110 received by the receiver 123 to convert the data into a parallel signal. Here, the loop data D110 which have been converted by the encoder 114 of the transmitting-end test circuit 110d into data that do not have the same value for successive unit times are subjected to the bit arrangement, thereby making the loop data into data in which the same values continue for 10 unit times, and the bit-arranged data are stored in the FIFO 125 on the PLL clock CKp1 for each unit time. The FIFO 125 outputs the stored parallel signal to the outside of the DUT 100d in sync with the test clock CK having a period of 10 unit time, as the 10 Mbps×10-bit output data Dout.

As described above, according to the test circuit of the third embodiment, the transmitting-end test circuit 110d and the receiving-end test circuit 120d are disposed on one chip, whereby the PLL 111 and the test divider 112 can be shared between the transmitting-end test circuit 110d and the receiving-end test circuit 120d. Further, the PLL 111 divides the frequency of the low-frequency test clock CK to generate the PLL clock CKp1 of an operating frequency that is defined under the test specifications, whereby the frequency of the test clock CK output from the tester 200 can be made lower than the operating frequency according to the test specifications. Further, the transmitting-end test circuit 110d distributes bits of the low-speed input data Din to convert the data into a serial signal by the encoder 114, thereby to transmit the loop data D110 at a transmission rate based on the test specifications, and the receiving-end test circuit 120d arranges the bits of the received loop data D110 to convert the data into a parallel signal by the decoder 124, thereby to output the output data Dout at low speed. Therefore, the speed of the input data Din output from the tester 200 and the speed of the output data Dout output from the receiving-end test circuit 120d to the tester 200 can be made lower than the transmission rate according to the test specifications. In addition, even when a signal of a lower frequency than the frequency based on the test specifications is input to the DUT 100d, the test can be conducted by operating the internal parts of the DUT 100d at the frequency based on test specifications.

[Embodiment 4]

Next, a test circuit according to a fourth embodiment of the present invention will be described with reference to the drawing.

Figure 5:
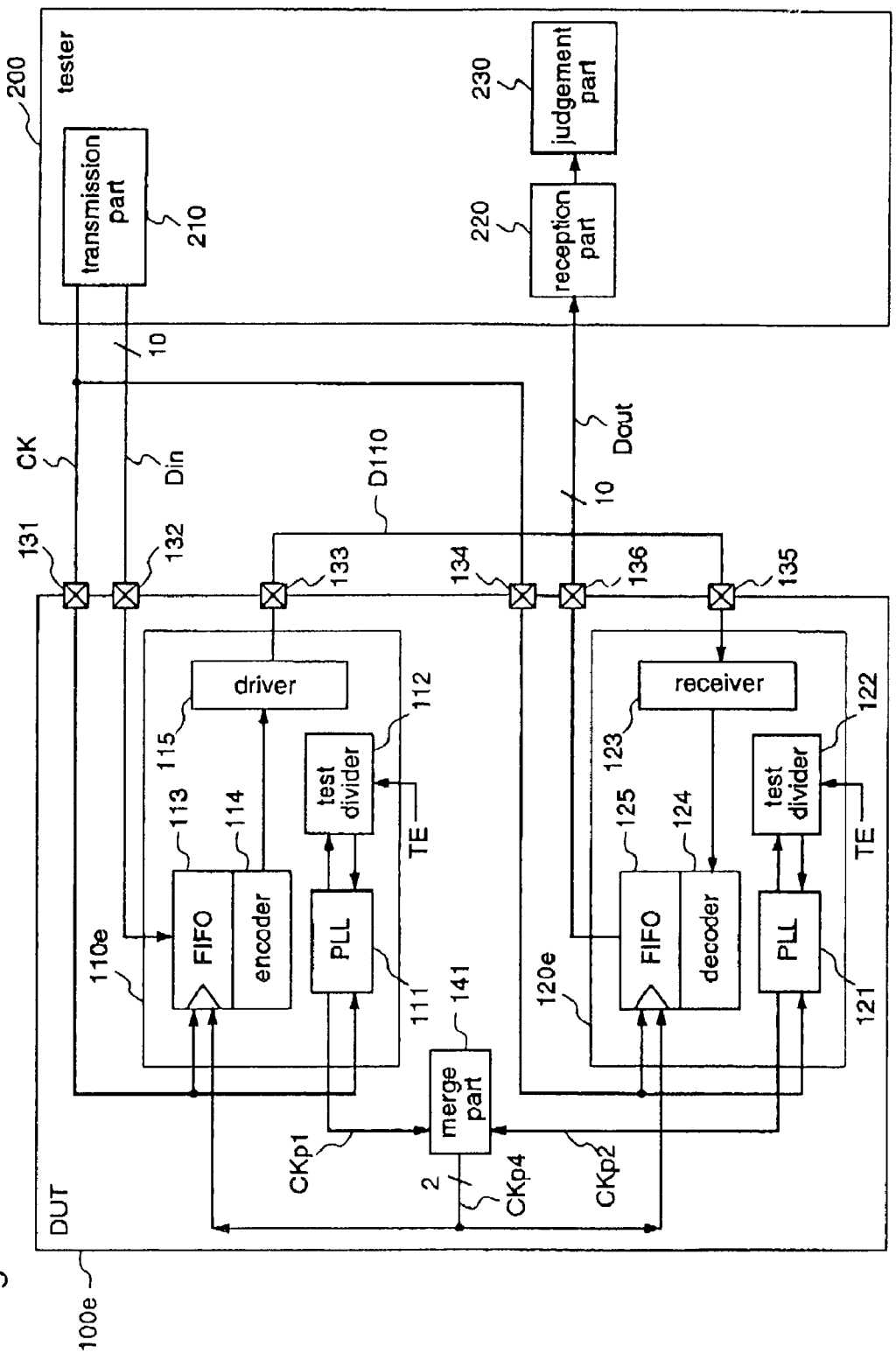
FIG. 5 is a block diagram illustrating a construction of a test circuit and a test method according to a fourth embodiment of the present invention.
Figure 6:
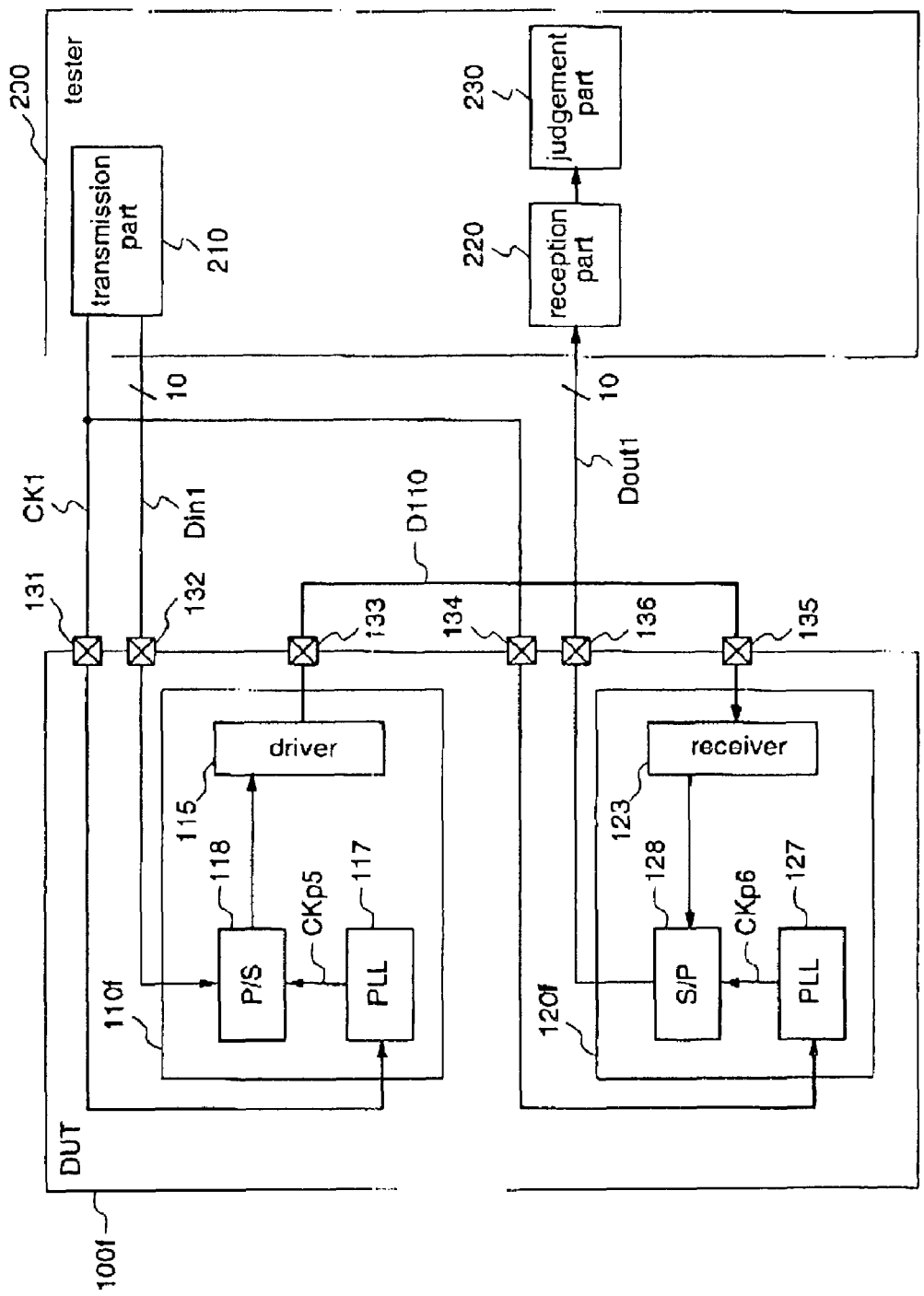
FIG. 6 is a block diagram illustrating a construction of a conventional test circuit and a conventional test method.

FIG. 5 is a block diagram illustrating a construction of the test circuit and a test method according to the fourth embodiment. In FIG. 5, the same or corresponding parts as those shown in FIG. 1 are denoted by the same reference numerals.

As shown in FIG. 5, according to a DUT 100e of the fourth embodiment, a transmitting-end test circuit 110e and a receiving-end test circuit 120e are disposed on one chip, and a merge part 141 for merging a PLL clock CKp1 generated at the transmitting-end test circuit 110e and a PLL clock CKp2 generated at the receiving-end test circuit 120e is provided.

The merge part 141 merges the PLL clock CKp1 and the PLL clock CKp2, thereby generating a PLL clock CKp4 of a doubled frequency, and outputs the PLL clock CKp4 to a FIFO 113 of the transmitting-end test circuit 110e and a FIFO 125 of the receiving-end test circuit 120e. The merging is performed for example by adjusting the phase of the PLL clock CKp2 with respect to that of the PLL clock CKp1.

Next, a description will be given of a method for testing the so-constructed DUT 100e employing the transmitting-end test circuit 110e and the receiving-end test circuit 120e.

A test clock CK is input to the transmitting-end test circuit 110e and receiving-end test circuit 120e of the DUT 100e. At this time, at the transmitting-end test circuit 110e, a test divider 112 activated by a test enable signal TE changes the frequency division ratio of a PLL 111 to multiply the frequency. Then, the PLL 111 divides the frequency of the test clock CK input from a tester 200 by the frequency division ration changed by the test divider 112, and outputs the PLL clock CKp1 to the merge part 141. On the other hand, at the receiving-end test circuit 120e, a test divider 122 activated by a test enable signal TE changes the frequency division ratio of a PLL 121 to multiply the frequency. Then, the PLL 121 divides the frequency of the test clock CK input from the tester 200 by the frequency division ration changed by the test divider 122, and outputs the PLL clock CKp2 to the merge part 141.

Then, the merge part 141 merges the PLL clock CKp1 and the PLL clock CKp2, thereby generating the PLL clock CKp4 of a doubled frequency, and outputs the PLL clock CKp4 to the FIFO 113 of the transmitting-end test circuit 110e and the FIFO 125 of the receiving-end test circuit 120e.

Further, when input data Din are input to the transmitting-end test circuit 110e, the FIFO 113 outputs the input data Din which are stored on the test clock CK, to an encoder 114 in sync with the PLL clock CKp4 having a frequency that has been changed by the merge part 141 to twice as high as that of the PLL clock CKp1. The encoder 114 distributes bits of the input data Din which are input on the PLL clock CKp4, to convert the data into a serial signal. A driver 115 converts this serial signal into a high-speed small-amplitude signal, and outputs loop data D110 to the outside of the DUT 100e.

The loop data D110 which are output to the outside of the DUT 100e are input to the DUT 100e again. The loop data D110 input to the receiving-end test circuit 120e are received by a receiver 123 and, then, output to a decoder 124. The decoder 124 arranges the bits of the loop data D110 to convert the data into a parallel signal, and outputs the parallel signal to the FIFO 125. Then, the FIFO 125 stores this parallel signal on the PLL clock CKp4 having the frequency that has been changed by the merge part 141 to twice as high as that of the PLL clock CKp2, and outputs data Dout which are synchronized with the low-frequency test clock CK, to the outside of the DUT 100e.

As described above, the test circuit according to the fourth embodiment is provided with the merge part 141 for merging the PLL clock CKp1 generated at the transmitting-end test circuit 110e and the PLL clock CKp2 generated at the receiving-end test circuit 120e, whereby the transmitting-end test circuit 110e and the receiving-end test circuit 120e can be operated on the clock having the frequency that is twice as high as the frequencies of the PLL clock CKp1 and the PLL clock CKp2. Therefore, the frequency of the test clock CK output from the tester 200 can be reduced to half the frequency of the test clock input to any of the DUT 100a–100d of the first to third embodiments. Further, the transmitting-end test circuit 110e distributes bits of the low-speed input data Din to convert the data into a serial signal by the encoder 114, thereby transmitting the loop data D110 at a transmission rate based on the test specifications, and the receiving-end test circuit 120e arranges the bits of the received loop data D110 to convert the data into a parallel signal by the decoder 124, thereby outputting the output data Dout at low speed. Therefore, the speed of the input data Din output from the tester 200 and the speed of the output data Dout output from the receiving-end test circuit 120e to the tester 200 can be made lower than the transmission rate according to the test specifications.

While in the aforementioned embodiments the same data continue for 10 unit times in the input data Din and the output data Dout of the input test pattern and the output test pattern, respectively, the period during which the same data continue may be arbitrary unit times. When the same data continue for N unit times in the input data Din and the output data Dout, the test dividers 112 and 122 change the frequency division ratio to one N-th of the original ratio. In this case, the period during which the same data continue in the input data Din and the output dada Dout is made longer, and the frequency of the test clock CK is multiplied by the test dividers 112 and 122, thereby further increasing the operating frequency of the internal parts of the DUTs.

What is claimed is:

1. A transmission device comprising:
   a clock generation unit which operates at a higher frequency at testing, which frequency is multiplied with respect to a frequency at a normal operation;
   a coding unit for distributing an input signal under a prescribed rule to obtain signals having the same frequency as a frequency of a clock that is generated by the clock generation unit; and
   a distributed signal output unit for outputting the signals obtained by the coding unit.

2. A reception device comprising:
   a clock generation unit which operates at a higher frequency at testing, which frequency is multiplied with respect to a frequency at a normal operation;
   a decoding unit for composing signals which are input at the same frequency as that of a clock generated by the clock generation unit, under a prescribed rule; and
   a composed signal output unit for outputting a signal obtained by the decoding unit.

3. A test circuit comprising a transmitting-end test circuit for transmitting a first output signal on the basis of test data and a test clock which are supplied at testing, and a receiving-end test circuit for generating a second output signal from the test clock and the first output signal, wherein
   said transmitting-end test circuit includes:
   a first PLL for generating a first PLL clock from the test clock;
   a coding unit for performing bit distribution, in accordance with the first PLL clock, to the test data which are input on the test clock; and
   a driver for converting the output of the coding unit into a high-speed differential signal, and outputting the first output signal, and
   said receiving-end test circuit includes:
   a receiver for receiving the first output signal;
   a second PLL for generating a second PLL clock from the test clock; and
   a decoding unit for performing bit arrangement, in accordance with the test clock, to an output signal from the receiver which is input on the second PLL clock, and outputting the second output signal.

4. The test circuit of claim 3 wherein
   said coding unit includes:
   a first data holding unit for capturing the test data which are input on the test clock; and
   an encoder circuit for performing data distribution to the data which are output from the first data holding unit on the first PLL clock, and
   said decoding unit includes:
   a decoder circuit for performing bit arrangement to the output data from the receiver; and
   a second data holding unit for capturing output data from the decoder circuit on the second PLL clock, and outputting the second output signal on the test clock.

5. The test circuit of claim 3 wherein
   the transmitting-end test circuit further includes a first test divider for changing the frequency division ratio of the first PLL to a prescribed value at the testing, and
   the receiving-end test circuit further includes a second test divider for changing the frequency division ratio of the second PLL to a prescribed value at the testing.

6. The test circuit of claim 5 wherein
   the text data are composed of identical data which are arranged continuously by N times ("N" is an integer that is equal to or larger than 2), and
   the frequency division ratios of the first test divider and the second test divider are 1/N.

7. The test circuit of claim 3 wherein
   the transmitting-end test circuit further includes a first test divider for changing the frequency division ratio of the first PLL to a prescribed value at the testing.

8. The test circuit of claim 7 wherein
   the test data are composed of identical data which are arranged continuously by N times ("N" is an integer that is equal to or larger than 2), and
   the frequency division ratio of the first test divider is 1/N.

9. A test circuit comprising:
   a first PLL for generating a first PLL clock from a test clock that is supplied at testing;
   a coding unit for performing bit distribution, in accordance with the first PLL clock, to test data which are supplied at the testing and input on the test clock;
   a driver for converting an output of the coding unit into a high-speed differential signal, and transmitting a first output signal;
   a receiver for receiving the first output signal; and
   a decoding unit for performing bit arrangement, in accordance with the test clock, to the output signal from the receiver which is input on the first PLL clock, and outputting a second output signal.

10. The test circuit of claim 9 wherein
    said coding unit includes:
    a first data holding unit for capturing the test data which are input on the test clock; and
    an encoder circuit for performing bit distribution to the data which are output from the first data holding unit on the first PLL block, and
    said decoding unit includes:
    a decoder circuit for performing bit arrangement to the output data from the receiver; and
    a second data holding unit for capturing output data from the decoder circuit on the first PLL clock, and outputting the second output signal on the test clock.

11. The test circuit of claim 9 further including:
    a first test divider for changing the frequency division ratio of the first PLL to a prescribed value at the testing.

12. The test circuit of claim 9 further including:
    a second PLL for generating a second PLL clock from the test clock, wherein
    the coding unit performs bit distribution to the test data in accordance with a merge clock which is obtained by merging the first PLL clock and the second PLL clock, and
    the output signal from the receiver is input to the decoding unit in accordance with the merge clock.

13. The test circuit of claim 12 further including:
a second test divider for changing the frequency division ratio of the second PLL to a prescribed value at the testing.

14. A test method comprising:
generating from a clock that is input to a transmission device at testing, a clock of a higher frequency that is multiplied with relative to a frequency at a normal operation;
distributing first data that is input to the transmission device, under a prescribed rule, to obtain signals having the same frequency as the frequency of said clock generated in said clock generation step;
outputting the distributed signals obtained in said distributing step;
inputting the signals output in said distributed signal output step to a reception device;
composing the signals input in said signal input step under a prescribed rule;
outputting a signal obtained in said composing step; and
comparing the signal output in said composed signal output step with said first data.

* * * * *